United States Patent
Dwivedi et al.

(10) Patent No.: US 7,242,630 B2
(45) Date of Patent: Jul. 10, 2007

(54) MEMORY DEVICE WITH REDUCED LEAKAGE CURRENT

(75) Inventors: Devesh Dwivedi, Faizabad (IN); Ashish Kumar, Ranchi (IN)

(73) Assignee: STMicroelectronics Pvt. Ltd., Noida, Uttar Pradesh (IN)

( * ) Notice: Subject to any disclaimer, the term of this patent is extended or adjusted under 35 U.S.C. 154(b) by 0 days.

(21) Appl. No.: 11/322,178

(22) Filed: Dec. 29, 2005

(65) Prior Publication Data

US 2006/0203536 A1   Sep. 14, 2006

(30) Foreign Application Priority Data

Dec. 30, 2004   (IN)   .................. 2598/DEL/2004

(51) Int. Cl.
*G11C 7/02*   (2006.01)
(52) U.S. Cl. .................. 365/206; 365/189.09
(58) Field of Classification Search ............. 365/206, 365/189.09
See application file for complete search history.

(56) References Cited

U.S. PATENT DOCUMENTS

| | | | |
|---|---|---|---|
| 5,345,216 A * | 9/1994 | Chopra et al. ........... | 340/146.2 |
| 6,320,795 B1 | 11/2001 | Balamurugan et al. | |
| 7,113,430 B2 * | 9/2006 | Hoefler et al. ......... | 365/185.23 |
| 2005/0105334 A1 * | 5/2005 | Futatsuyama .......... | 365/185.17 |
| 2005/0195656 A1 * | 9/2005 | Chen ..................... | 365/185.19 |
| 2005/0248976 A1 * | 11/2005 | Huang et al. ............... | 365/149 |
| 2005/0254302 A1 * | 11/2005 | Noguchi ................ | 365/185.17 |

* cited by examiner

*Primary Examiner*—Michael Tran
(74) *Attorney, Agent, or Firm*—Hogan & Hartson LLP

(57) ABSTRACT

A technique for reducing the bitline leakage current while maintaining a level of performance characteristics of low threshold voltage transistors in deep submicron CMOS technology incorporates a reference voltage generator circuit in combination with bias transistor MBIAS. The output of a static logic gate is connected to the input terminal of the pull-down devices. The reduction in leakage current through pull-down devices whenever a read operation is not performed contributes to a significant reduction in overall leakage current in the circuit.

9 Claims, 6 Drawing Sheets

MEMORY DEVICE WITH REDUCED LEAKAGE CURRENT

RELATED APPLICATION

The present application claims priority of India Patent Application No. 2598/Del/2004 filed Dec. 30, 2004, which is incorporated herein in its entirety by this referenced.

FIELD OF THE INVENTION

The invention relates to a memory device with reduced leakage current.

BACKGROUND OF THE INVENTION

The impact of the subthreshold leakage current on the circuit performance should be considered seriously as device dimension have scaled down to deep submicron level in CMOS technology. This is a significant problem in memory structures using precharging circuitry which frequently require discharging of the bitlines to allow bit sensing in memories.

FIG. 1 illustrates the schematic diagram for a conventional memory cell that operates as a single storage unit in a larger memory structure. One problem with such memory cells is the leakage current through multiple read transistors 30 coupled to a shared bitline 14 which can result in erroneous read operation. Increased leakage current severely affects the performance of the memory circuits (e.g., register files). Further, the problem is increased by noise on the read signal line due to coupling noise.

One way to reduce the leakage current is utilization of high threshold voltage ($V_T$) devices. However, such devices exhibit reduced performance in terms of device speed and area. In addition, manufacturing costs are increased in high $V_T$ devices due to the additional silicon layers required in such devices.

To overcome this problem, FIG. 2 illustrates memory circuits according to U.S. Pat. No. 6,320,795. The patent discloses a register file cell 40 which is capable of reducing leakage current and is less likely to require a larger keeper transistor 26 to prevent erroneous reads. Memory cell 40 includes a pull-down transistor (MPD) 42, a static logic gate 44, and a storage cell 46. Pull-down transistor 42 is operative for discharging the bitline 14 to the ground 36 when a predetermined control indication is received at the input terminal thereof from the logic gate 44. In this embodiment, an N-channel IGFET device is used as the pull-down transistor 42 and therefore, the predetermined control indication is a logic high value applied to the gate terminal of pull-down transistor 42.

Logic gate 44 acts to buffer the input of the pull-down transistor 42 from the noise commonly associated with the read signal. Logic gate 44 includes two input terminals 48 and 50.

When the read signal is logic low and the data stored in the register file cell is logic high, logic gate 44 (NOR gate) outputs a logic high value to the gate terminal of pull-down transistor 42. As a result, pull-down transistor 42 discharges bitline 42 to ground 36. When stored data value in cell is logic low and when the read signal is logic low, the output of logic gate 44 is logic low which results in pull-down transistor 42 to be turned off and hence, bitline 14 is not discharged. The output of the logic gate 44 is logic low when the active low read signal is logic high, regardless of the data bit value stored in cell 46.

Thus the goal is to isolate pull-down transistor 42 from the read noise associated with the read signal. Although the application of a static logic gate helps to reduce such leakage current to a significant level in such circuits, this approach is effective for reducing the leakage currents generated only due to the noise voltages on the input terminal of pull-down transistor 42. The technique does not have significant impact on the leakage currents typically associated with low $V_T$ scaled devices.

FIG. 3 shows a schematic diagram illustrating a register file cell 60 with another embodiment. Memory cell 60 includes a pull-down transistor 62 (MPD), logic gate 64, a storage cell 66, a bias device 72 and a read transistor 74 (MREAD). Logic gate 64 of memory cell 60 provides isolation between a possibly noisy read signal and the input terminal of pull-down transistor 62, in the same way as in previous case. In addition, bias device 72 is operative for applying a bias voltage to pull-down transistor 62 during appropriate periods and thereby reduces the level of the current leakage through the device during those periods. Thus memory cell 60 can be implemented using low $V_T$ transistors to achieve high performance operation while still maintaining high robustness.

When the read signal is logic high, a read transistor 74 couples the second output terminal of pull-down transistor 62 to ground 36. Therefore a logic low voltage is present at the second input 70 of logic gate 64. During a read operation, the output of logic gate 64 is logic high when the data bit stored within cell 66 is logic low. Under this condition, pull-down transistor 62 is turned on and bitline 14 is discharged to the ground 36 through read transistor 74. When the data bit stored within cell 66 is logic high, the output of logic gate 64 is low and pull-down transistor 62 remains off.

When the read signal is logic high (i.e., a read operation is being performed for cell 60), bias device 72 (P-channel IGFET) is off and has substantially no effect on the circuit. When the read signal is logic low (i.e., a read operation is not being performed for cell 60), bias device 72 couples the supply terminal 18 to the second output terminal of pull-down transistor 62. This places a logic high voltage on the second input 70 of logic gate 64, which forces the output of the logic gate to a logic low value. Therefore a negative voltage exists from the input terminal of pull-down transistor 62 to the second output terminal of pull-down transistor 62. As transistor 62 is an N-channel IGFET device, the negative voltage from the input terminal (the gate) of pull-down transistor 62 to the second output terminal ( the source) of pull-down transistor 62 reduces the leakage current through pull-down transistor 62 to negligible levels. When the read signal again switches to a logic high value, the bias voltage is removed from pull-down transistor 62 and a read operation takes place.

As described in the prior art, such an embodiment is capable of reducing leakage current through pull-down transistor 62 due to the effect of read noise associated with read signal on the input of pull-down transistor 62. This helps to reduce the leakage level through pull-down transistor 62 due to generation of a negative voltage from the input terminal (i.e., the gate terminal) of pull-down transistor 62 to the second output terminal (i.e., the source terminal) of pull-down transistor 62.

The drawback of such an arrangement is its inability to check the leakage current through pull-down transistor 74. Also the presence of bias transistor X raises the potential of intermediate node 80 near to supply voltage whenever read signal is low (i.e., when a read operation is not being performed). This technique appears to be unable to reduce the leakage current to the same order at a very low potential of intermediate node. In such memory circuit arrangement, significant leakage current is produced because of low $V_T$ pull-down devices 107 and 117 used to maintain high performance. Hence, the goal of the bias device is to reduce leakage through pull-down transistor 62 during some or all of the non-read period associated with a register file cell.

SUMMARY OF THE INVENTION

To obviate the aforesaid drawbacks the object of the instant invention is to provide a memory device with reduced leakage current.

Another object of the instant invention is to lower down the leakage current through pull-down low threshold voltage ($V_T$) semiconductor device.

Another object of the instant invention is to provide memory cells using submicron technology with improved performance characteristics in speed, area and cost.

A memory device of the present invention having reduced leakage current includes at least one bitline and a plurality of memory cells, with each memory cell passing at least one output of a storage cell and each output coupled to each bitline through read access circuitry. The read access circuitry includes a logic device responsive to data value stored in the storage cells and a read signal for generating a control output, a first switching device having its control terminal coupled to the control output of the logic device and its first terminal coupled to the bitline, a second switching device with its control terminal coupled to the control output of the logic device for passing a low voltage to a common terminal of said first and said second switching devices, and a third switching device for passing a node reference voltage to the common terminal which is responsive to the control output of the logic device.

Preferably, the node reference voltage for the third switching device in all memory cells is passed from a common reference voltage generator. In a preferred embodiment, the common reference voltage generator includes a plurality of diode-connected transistors connected in series, with one end of the series coupled to a high voltage source and other end of the series coupled to the output of the common reference voltage generator.

BRIEF DESCRIPTION OF THE ACCOMPANYING DRAWINGS

FIG. 1 illustrates a commonly used memory circuit.

FIGS. 2 and 3 show embodiments of U.S. Pat. No. 6,320,795.

DETAILED DESCRIPTION

Figure 4:
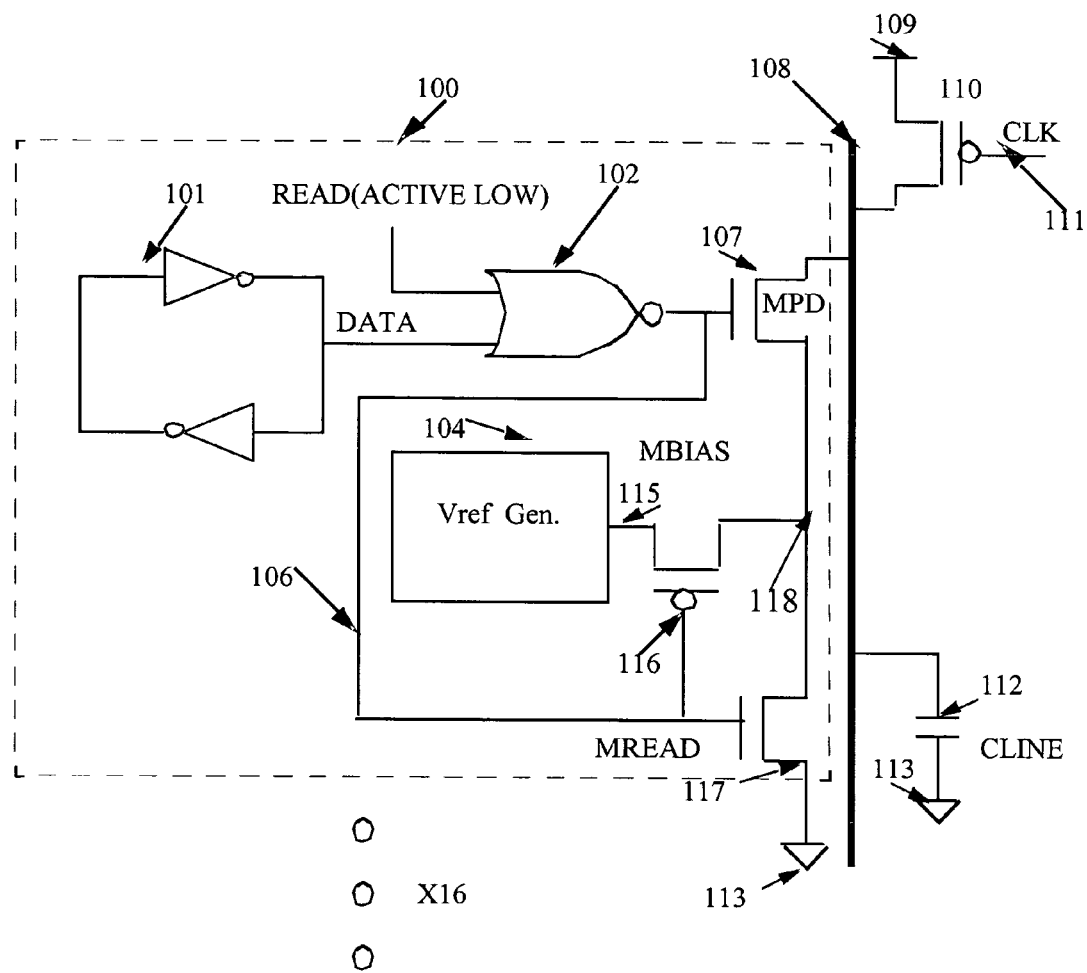
FIG. 4 shows a circuit in accordance with the invention.

FIG. 4 illustrates a memory cell according to one of the embodiments of the instant invention. A memory cell 100 comprises a storage cell 101, a static logic gate 102, a reference voltage generator circuit 104, pull-down transistors 107 and 117, and a bias transistor MBIAS 115. A pull-down transistor 107 is coupled to bitline 108 for conditionally discharging the precharged bitline 108 during a read operation based on a data stored in storage cell 101. Static logic gate 102, which is a NOR gate in the present embodiment, drives pull-down transistor 107 depending upon the Read signal and data stored in cell 101. It also act as a buffer between possibly noisy read signal and the input terminal of pull-down transistor 107. In present embodiment a reference voltage generator circuit 104 along with a bias transistor MBIAS(P-channel MOSFET) is used for significant reduction of bitline 108 leakage through ground 113.

When the read signal is logic low (i.e., a read operation is to be performed) and data stored in bit cell 101 is also logic low, output of the static logic gate 102 is logic high. This turns on pull-down transistors 107 and 117 resulting in discharging of bitline 108 through the ground 113. Under this condition a logic high is present at the gate terminal 116 of bias transistor MBIAS and hence turning it off. Therefore no effect of reference voltage generator 104 is seen at node 118 of the circuit. For the opposite case when read signal is logic high, the output of the static logic gate 102 is logic low regardless of data bit value stored in cell 101. As the output of the static logic gate 102 is connected to gate terminal of the both pull-down transistors 107 and 117, both pull-down devices are off and therefore bitline 108 is decoupled from the ground 113.

When the read signal is high (i.e., no read operation is being performed) a low logic value at the output of the static logic gate 102, turns on the bias transistor MBIAS. Therefore the voltage reference generator circuit 104 raises the potential level of the intermediate node 118 just above the threshold voltage (depending on the nature of the reference voltage generator circuit) of pull-down devices 107 and 117. The leakage current through pull-down transistor 107 approaches a lower level as the potential at intermediate node 118 is just above the threshold voltage of the pull-down device. Also, as intermediate node 118 is charged to a lower potential (just above the $V_T$ of pull-down device), unlike to the supply level in U.S. Pat. No. 6,320,795, hence circuit performance is improved due to reduction in charging/discharging time.

Figure 5:
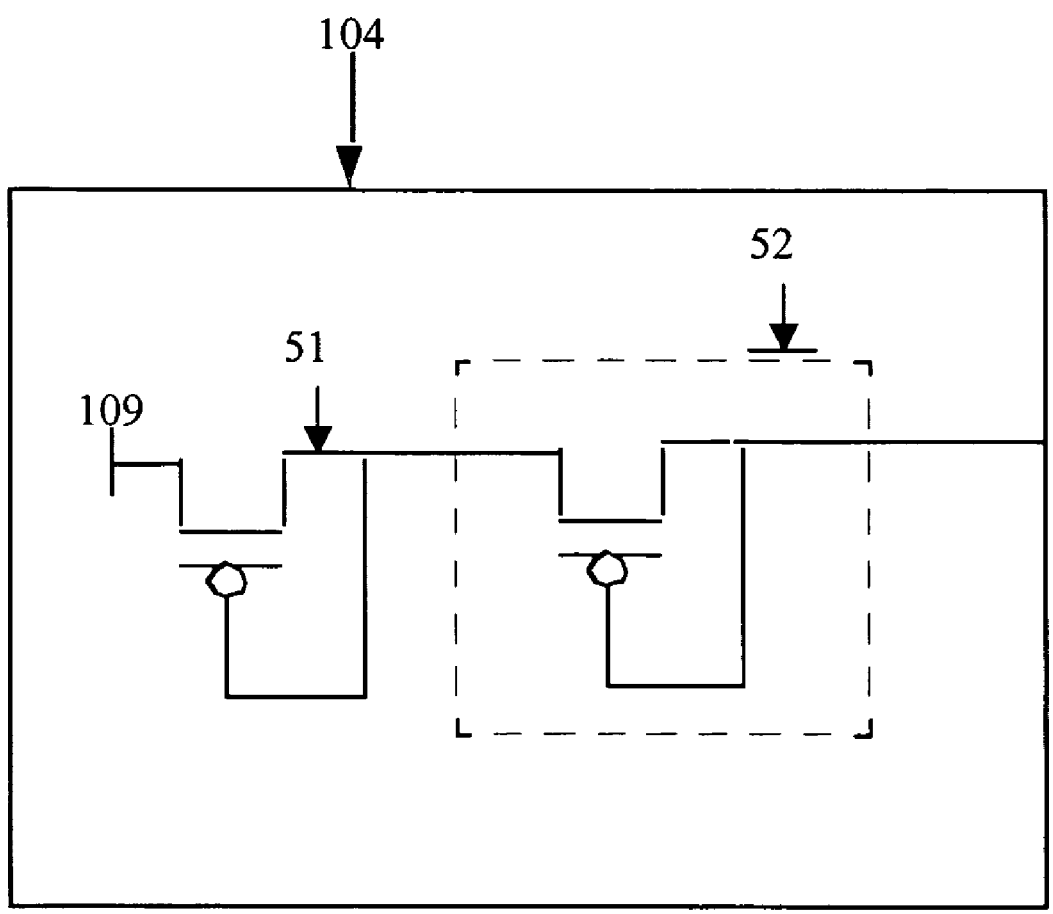
FIG. 5 illustrates another embodiment of the present invention.

FIG. 5 illustrates a simplest embodiment of the voltage reference generator of the present invention. According to this embodiment, diode connected transistors 51 and 52 are connected in series to high voltage supply 109 to produce voltage drop and produce desired voltage at the output. The goal behind the adding of a voltage reference generator circuit is to provide a lower voltage just above $V_T$ of pull-down device to the intermediate node 118. The area overhead due to the addition of the circuit 104 is negligible because the reference voltage generator circuit 104 is shared among a number of memory cell circuit 100.

Figure 6:
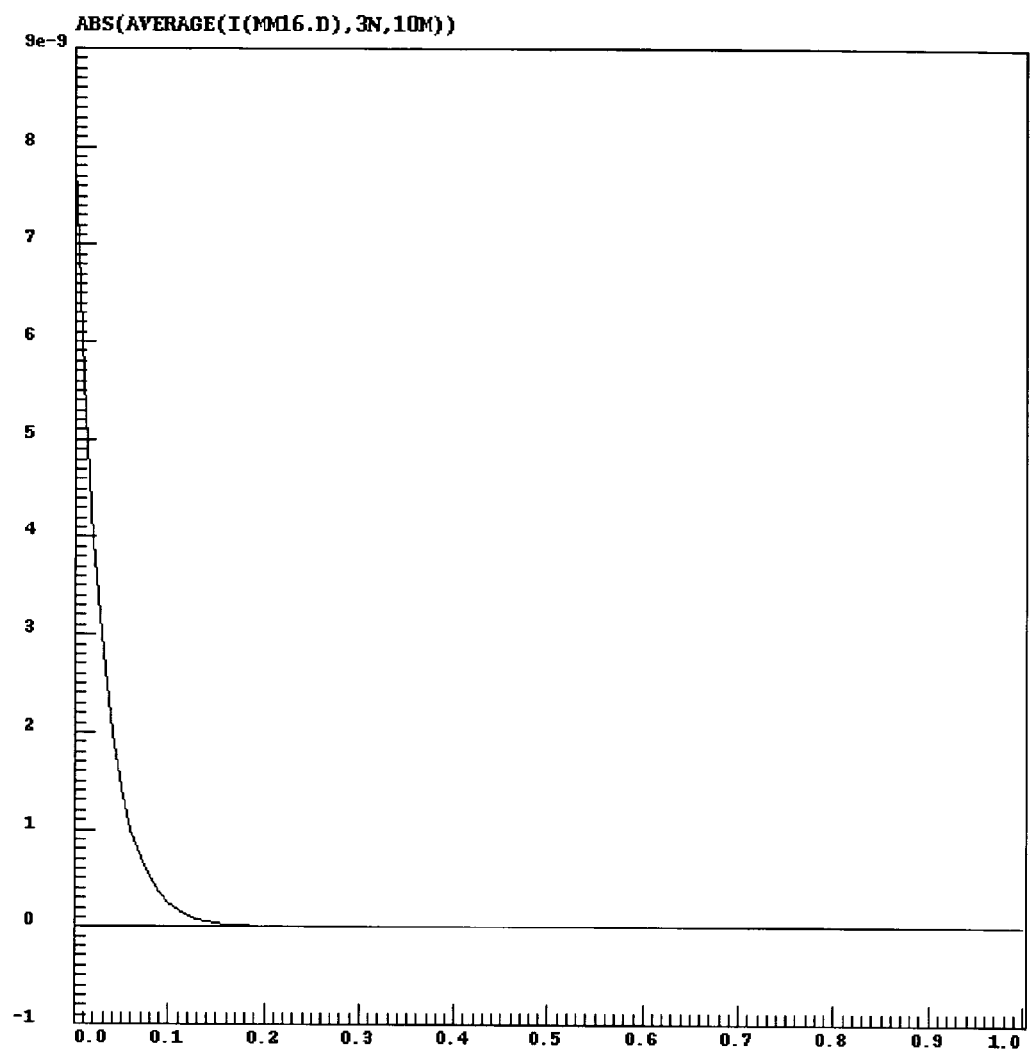
FIG. 6 show the simulation results.

FIG. 6 illustrates that the goal of lowering down the leakage current through pull-down device 107 is achieved at a very low potential Oust above the $V_T$ of pull-down device) of intermediate node 118, in comparison to a significantly high potential (near to supply) of U.S. Pat. No. 6,320,795. As the intermediate node 118 potential reaches below the $V_T$ of pull-down device, the bit-Line leakage current increases abruptly. Hence, the best case scenario is when the intermediate node potential is just above the $V_T$ of the pull-down device 107.

Figure 1:
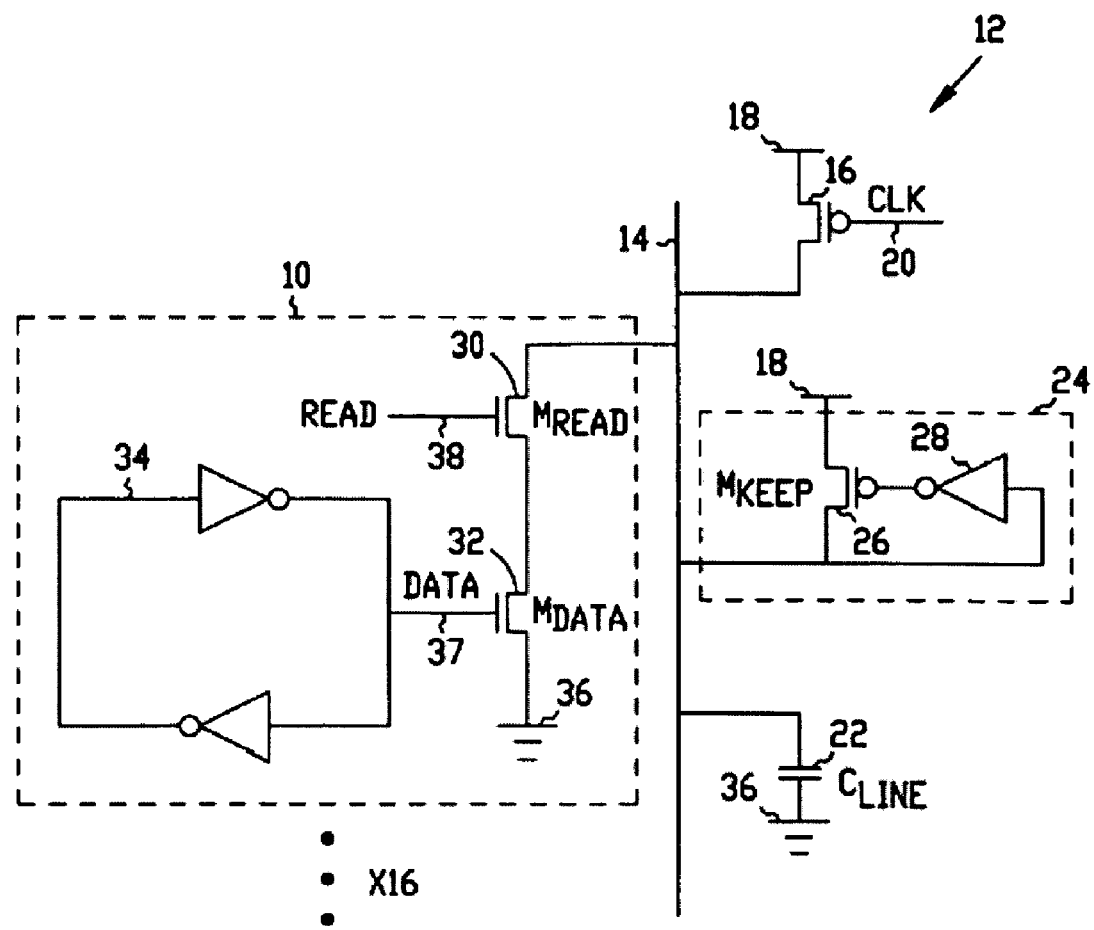
Figure 2:
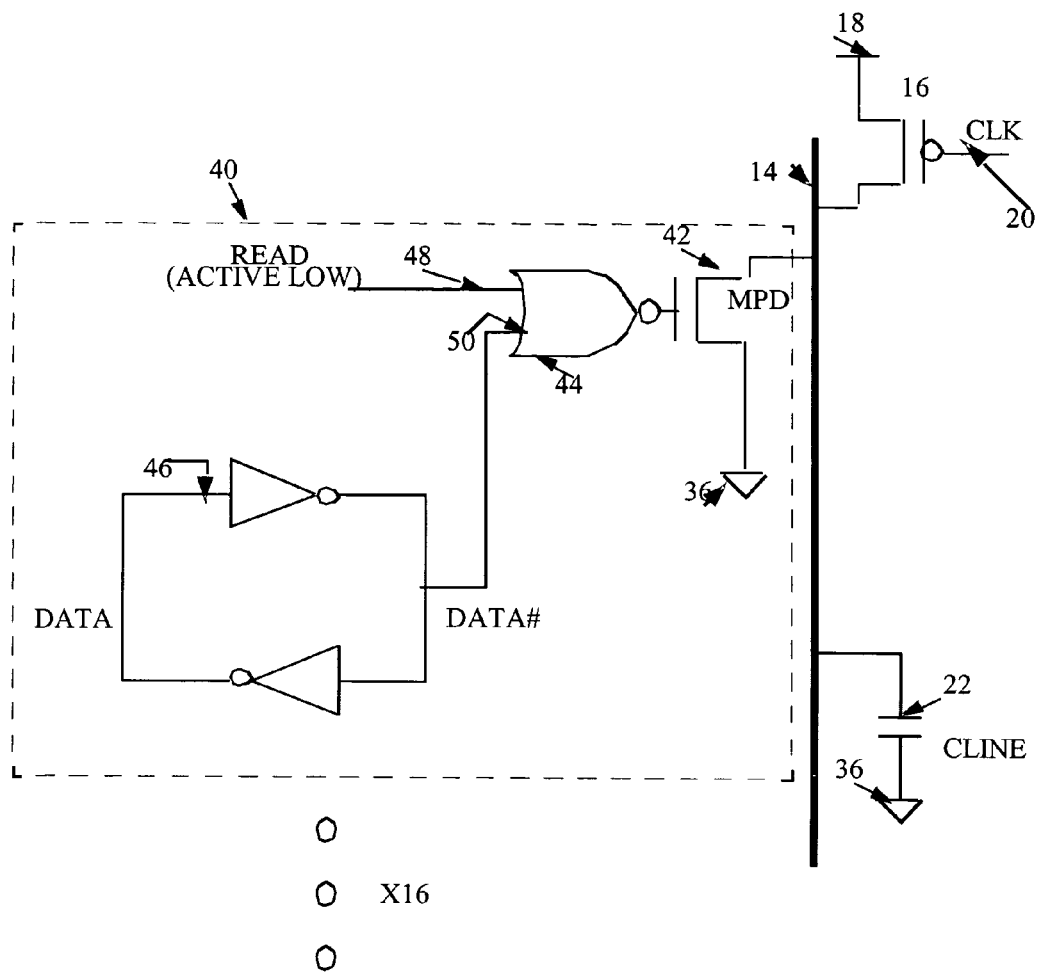
Figure 3:
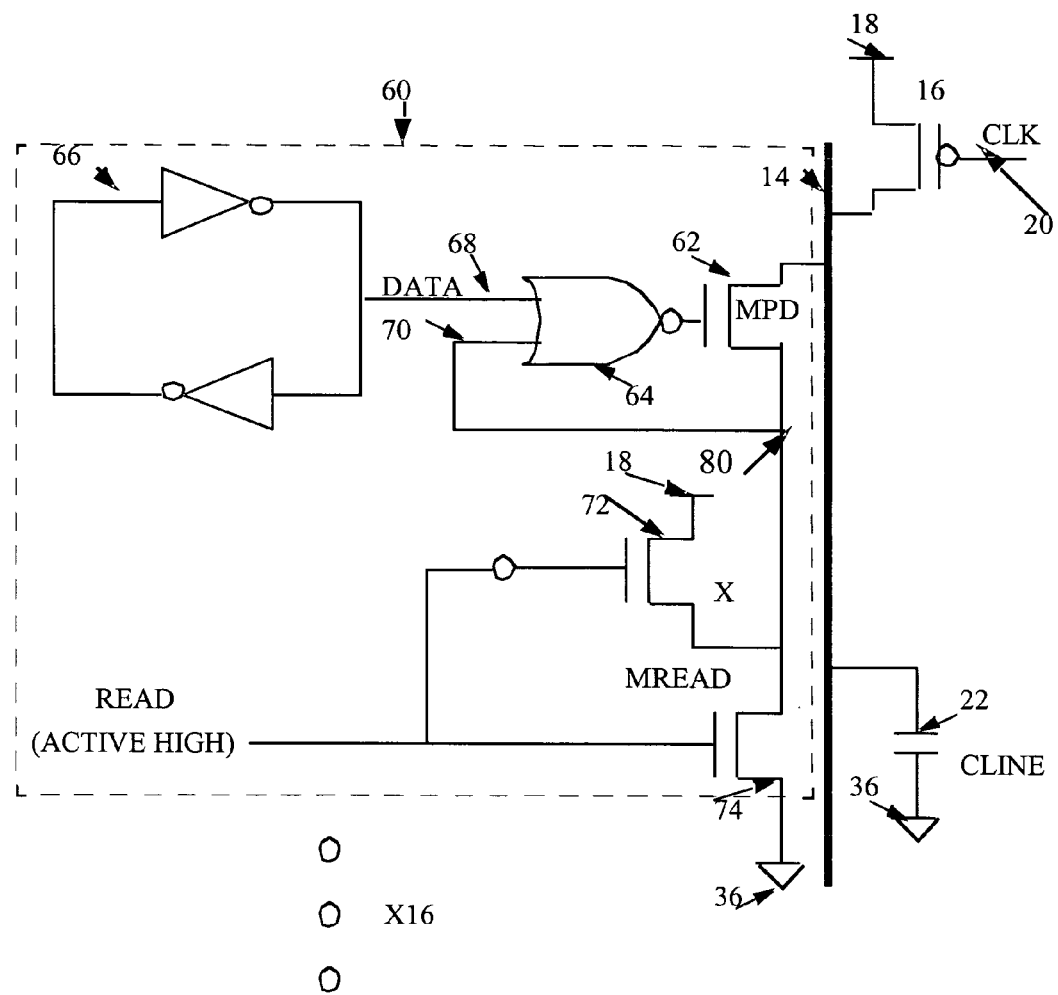

Table 1, shows the simulation results for the set-up of the prior art as shown in FIG. 2.

Simulation results for the set-up of the present invention shown in FIG. 4 are given in Table 2. Simulation is performed under the following conditions: Pull-down devices 107 and 117 are 4 microns in size. The size of static logic gate 102 and keeper device 110 are kept to a minimum and the load of the bitline 108 is taken as 100 fF.

Table 2 shows the variation in leakage current with potential at intermediate node 118. Bitline 108 is pulled down only when both read enable and data value stored in cell 101 are logic low.

As the intermediate node potential approaches above $V_T$ of the pull-down device, the total leakage current reduces significantly. Simulation result shows ~57% reduction in total leakage current at node potential 305 mv in comparison to the prior art.

TABLE 2

| PRIOR ART SIMULATIONS. | | | | |
|---|---|---|---|---|
| DATA | READ ENABLE | BIT-LINE LEAKAGE | PMOS LEAKAGE | TOTAL LEAKAGE |
| LOGIC HIGH | LOGIC LOW | 1E-12 | 7.89E-09 | 7.891E-09 |
| LOGIC HIGH | LOGIC HIGH | 7.89E-09 | 0.5E-09 | 8.39E-09 |

| PRESENT INVENTION SIMULATIONS | | | |
|---|---|---|---|
| NODE POTENTIAL | BIT-LINE LEAKAGE | Vref. Gen. LEAKAGE | TOTAL LEAKAGE |
| 778 mv | 1.22E-12 | 6.15E-09 | 6.151E-09 |
| 545 mv | 1.45E-12 | 4.65E-09 | 4.651E-09 |
| *305 mv | 1.87E-12 | 3.36E-09 | 3.361E-09 |
| 126 mv | 0.1E-09 | 2.40E-09 | 2.5E-09 |

Although the present invention is described in reference to register file memories with a single bitline, it can applied to all types of memories in CMOS ICs requiring precharge/discharge mechanism. According to yet another embodiment, the circuitry can be extended to memories with multiple bitline for memories producing stored data value and its complementary value. According to yet another embodiment, the logic gates or transistor used in the embodiment may be changed for the memory to be in active phase for high read signal. Those of ordinary skill in the art will appreciate that various combinations and arrangements may be employed without departing from the scope of the invention It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an exemplary embodiment thereof, it is the intention of the following claims to encompass and include such changes.

We claim:

1. A memory device with reduced leakage current comprising:
   at least one bitline; and
   a plurality of memory cells, each memory cell passing at least one output of a storage cell and each said output coupled to each said bitline through a read access circuitry; said read access circuitry comprising:
      a logic device responsive to data value stored in said storage cells and a read signal for generating a control output;
      a first switching device with its control terminal coupled to the control output of said logic device and its first terminal coupled to the bitline;
      a second switching device with its control terminal coupled to the control output of said logic device for passing a low voltage to a common terminal of said first and said second switching devices; and
      a third switching device for passing a node reference voltage to said common terminal responsive to the control output of said logic device.

2. A memory device with reduced leakage current as claimed in claim 1 wherein said node reference voltage for said third switching device in all said memory cells is passed from a common reference voltage generator.

3. A memory device with reduced leakage current as claimed in claim 2 wherein said common reference voltage generator comprises a plurality of diode-connected transistors connected in series with one end of the series coupled to a high voltage source and other end of the series coupled to the output of said common reference voltage generator.

4. A memory device with reduced leakage current as claimed in claim 1 wherein said logic device comprises a NOR gate.

5. A memory device with reduced leakage current as claimed in claim 1 wherein said first switching device is a N-type metal-oxide semiconductor (NMOS) device.

6. A memory device with reduced leakage current as claimed in claim 1 wherein said second switching device is a N-type metal-oxide semiconductor (NMOS) device.

7. A memory device with reduced leakage current as claimed in claim 1 wherein said third switching device is a P-type metal-oxide semiconductor (PMOS) device.

8. A memory device with reduced leakage current as claimed in claim 3 wherein said diode-connected transistor is a P-type metal-oxide semiconductor (PMOS) device.

9. A memory device with reduced leakage current as claimed in claim 1 wherein said node reference voltage is larger than threshold voltage for said first and second switching devices.

* * * * *